United States Patent
Park

(10) Patent No.: US 11,879,947 B2
(45) Date of Patent: Jan. 23, 2024

(54) BATTERY MANAGEMENT DEVICE AND BATTERY PACK INCLUDING SAME

(71) Applicant: LG CHEM, LTD., Seoul (KR)

(72) Inventor: Jun-Cheol Park, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 588 days.

(21) Appl. No.: 17/251,077

(22) PCT Filed: Dec. 20, 2019

(86) PCT No.: PCT/KR2019/018236
§ 371 (c)(1),
(2) Date: Dec. 10, 2020

(87) PCT Pub. No.: WO2020/145550
PCT Pub. Date: Jul. 16, 2020

(65) Prior Publication Data
US 2021/0247461 A1    Aug. 12, 2021

(30) Foreign Application Priority Data

Jan. 10, 2019 (KR) ......................... 10-2019-0003388

(51) Int. Cl.
*G01R 31/396* (2019.01)
*G01R 31/3835* (2019.01)
(Continued)

(52) U.S. Cl.
CPC ......... *G01R 31/396* (2019.01); *G01R 31/371* (2019.01); *G01R 31/3835* (2019.01); *H02J 7/0013* (2013.01); *H02J 7/0047* (2013.01)

(58) Field of Classification Search
CPC .................................................. G01R 31/396
(Continued)

(56) References Cited

U.S. PATENT DOCUMENTS 9,436,261 B2    9/2016 Yun
9,720,872 B2    8/2017 Southcombe et al.
(Continued)

FOREIGN PATENT DOCUMENTS

CN    101997322 A    3/2011
CN    103650290 A    3/2014
(Continued)

OTHER PUBLICATIONS

Extended European Search Report dated Dec. 2, 2021 issued by the European Patent Office for corresponding European Patent Application No. 19908677.8.
(Continued)

*Primary Examiner* — Yalkew Fantu
(74) *Attorney, Agent, or Firm* — Morgan, Lewis & Bockius LLP

(57) ABSTRACT

A battery management device according to an aspect of the present disclosure includes: a plurality of slave controllers including at least one sensing port connected to at least one battery cell provided to a plurality of battery modules through a sensing line to sense a voltage of each connected battery cell and at least one ID allocation port for receiving the voltage from the sensing line when being connected to the sensing line, the plurality of slave controllers being configured to be connected to at least one corresponding battery module among the battery modules; and a master controller connected to the plurality of slave controllers, respectively, to receive voltage information about the voltage applied to the ID allocation port from the slave controller and allocate a regular ID to each of the plurality of slave controllers based on the received voltage information.

13 Claims, 5 Drawing Sheets

(51) Int. Cl.
*G01R 31/371* (2019.01)
*H02J 7/00* (2006.01)

(58) Field of Classification Search
USPC .......................................................... 320/134
See application file for complete search history.

(56) References Cited

U.S. PATENT DOCUMENTS

| | | | |
|---|---|---|---|
| 2011/0175574 A1 | 7/2011 | Sim et al. | |
| 2013/0314094 A1* | 11/2013 | Farmer | H01M 10/482 |
| | | | 324/426 |
| 2014/0091769 A1 | 4/2014 | Kim et al. | |
| 2014/0091770 A1 | 4/2014 | Lee et al. | |
| 2014/0354236 A1* | 12/2014 | Kim | H02J 7/0016 |
| | | | 320/134 |
| 2014/0365792 A1 | 12/2014 | Yun | |
| 2017/0005501 A1* | 1/2017 | Yi | H02J 7/0029 |
| 2017/0237707 A1 | 8/2017 | Jo | |
| 2018/0233928 A1* | 8/2018 | Li | H02J 7/0029 |

FOREIGN PATENT DOCUMENTS

| | | |
|---|---|---|
| CN | 104242375 A | 12/2014 |
| CN | 106797260 A | 5/2017 |
| JP | 2013-165569 A | 8/2013 |
| KR | 10-1156342 B1 | 6/2012 |
| KR | 10-2013-0033197 A | 4/2013 |
| KR | 10-2013-0053885 A | 5/2013 |
| KR | 10-1386080 B1 | 4/2014 |
| KR | 10-2014-0068331 A | 6/2014 |
| KR | 10-1539689 B1 | 7/2015 |
| KR | 10-1561885 B1 | 10/2015 |
| KR | 10-2017-0056061 A | 5/2017 |
| KR | 10-2018-0094353 A | 8/2018 |

OTHER PUBLICATIONS

Office Action dated Mar. 17, 2022, issued by the Korean Intellectual Property Office in corresponding Korean Patent Application No. 10-2019-0003388.
International Search Report issued in corresponding International Patent Application No. PCT/KR2019/018236, dated Apr. 3, 2020.
Office Action dated Sep. 20, 2023, issued in corresponding Chinese Patent Application No. 201980036171.0. (Note: KR 10-2014-0068331 A was previously cited.).

* cited by examiner

BATTERY MANAGEMENT DEVICE AND BATTERY PACK INCLUDING SAME

TECHNICAL FIELD

The present application claims priority to Korean Patent Application No. 10-2019-0003388 filed on Jan. 10, 2019 in the Republic of Korea, the disclosures of which are incorporated herein by reference.

The present disclosure relates to a battery management device for managing a plurality of battery modules including at least one battery cell, and a battery pack including same.

BACKGROUND ART

Recently, as the demand for portable electronic products such as laptops, video cameras, mobile phones, and the like is rapidly increased and the development of electric vehicles, storage batteries for energy storage, robots, satellites, and the like is in earnest, high-performance batteries capable of repeatedly charging and discharging is actively studied.

Batteries currently commercialized include nickel cadmium batteries, nickel hydride batteries, nickel zinc batteries, and lithium batteries. Among them, the lithium batteries have almost no memory effect compared to nickel-based batteries, to freely charge and discharge, and have a very low high self-discharge rate and a high energy density. Thus, lithium batteries have attracted much attention.

A battery pack applied to an electric vehicle or the like typically includes a plurality of battery modules and a plurality of slave controllers connected in series and/or in parallel with each other. Each slave controller monitors and controls the status of the battery module designated to be managed by the corresponding slave controller. As a large-capacity and high-power battery pack is required recently, the number of battery modules included in the battery pack is also increased. In order to efficiently manage each battery module included in the battery pack, a multi slave structure is disclosed. The multi slave structure includes a plurality of slave controllers respectively installed to the battery modules and a master controller for controlling the plurality of slave controllers overall.

In a battery pack having a multi slave structure, in order for the master controller to collect state information of the plurality of battery modules from the plurality of slave controllers and to transmit a control command for the plurality of battery modules to the plurality of slave controllers, each slave controller must be allocated with an ID that indicates a physical or electrical location of the battery module that is managed by the corresponding slave controller.

As a prior art, Patent Literature 1 (KR 10-1156342 B1) discloses a battery ID setting system and a driving method thereof, which sequentially allocates IDs to a plurality of slave controllers.

This prior art mainly presupposes that the master controller and the slave controllers are connected in a wired manner. That is, Patent Literature 1 just discloses that, in a state in which the master controller and the slave controllers are connected in a wired manner, relative IDs of a plurality of batteries are set according to a location order of the plurality of batteries in hardware in consideration of a battery potential difference.

However, if the master controller and the slave controllers are connected in a wired manner as above, there are problems such as concerns about wire disconnection, a complicated structure, difficulty in manufacturing, and large space limitations. In order to solve these problems, a configuration in which the master controller and the slave controllers are wirelessly connected has been proposed. However, unlike the conventional wired connection, the wireless connection has no connection line between the master controller and the slave controllers, and thus there is a problem that the conventional ID allocation method cannot be applied as it is.

DISCLOSURE

Technical Problem

The present disclosure is designed to solve the problems of the related art, and therefore the present disclosure is directed to providing a battery management device for effectively allocating IDs to a plurality of slave controllers, and a battery pack including same.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various aspects and embodiments of the present disclosure for accomplishing the above objects are as follows.

A battery management device according to an aspect of the present disclosure comprises: a plurality of slave controllers including at least one sensing port connected to at least one battery cell provided to a plurality of battery modules through a sensing line to sense a voltage of each connected battery cell and at least one ID allocation port for receiving the voltage from the sensing line when being connected to the sensing line, the plurality of slave controllers being configured to be connected to at least one corresponding battery module among the battery modules; and a master controller connected to the plurality of slave controllers, respectively, to receive voltage information about the voltage applied to the ID allocation port from the slave controller and allocate a regular ID to each of the plurality of slave controllers based on the received voltage information.

The ID allocation port may be configured to be selectively connected to a line diverged from the sensing line and receive the voltage through the selectively connected diverged line.

The plurality of slave controllers may be configured such that, among the ID allocation ports included therein, only a specific ID allocation port set differently for each slave controller is electrically connected to the sensing line.

The plurality of slave controllers may be configured to transmit information about the specific ID allocation port electrically connected to the sensing line to the master controller in a binary expression.

The sensing port may be provided in plural to each slave controller such that the plurality of sensing ports are connected to a plurality of sensing lines.

The specific ID allocation port may be configured to be connected to a line diverged from a specific sensing line among the plurality of sensing lines.

The specific ID allocation port may be configured to be connected to the line diverged from the specific sensing line in a one-to-one relationship.

The plurality of slave controllers may be configured to include a minimum integer number equal to or greater than $\log_2 N$ of ID allocation ports, where N may be the number of all battery modules included in the battery pack.

The plurality of slave controllers may be configured to generate voltage information about the voltage applied to the ID allocation port based on an arrangement order of the ID allocation port and transmit the generated voltage information and a previously stored temporary ID to the master controller.

The master controller may be configured to receive the generated voltage information and the temporary ID from each of the plurality of slave controllers, generate a regular ID corresponding to the received voltage information based on a previously stored regular ID allocation table, match the received temporary ID and the generated regular ID in a one-to-one relationship, and generate a data pair including the temporary ID and the regular ID matched with each other.

The master controller may be configured to transmit the data pairs respectively generated for the plurality of slave controllers to all of the plurality of slave controllers.

The plurality of slave controllers may be configured to receive the data pairs, select a data pair including the previously stored temporary ID among the received data pairs, and update the previously stored temporary ID to the regular ID included in the selected data pair.

A battery pack according to another aspect of the present disclosure may comprise the battery management device according to an embodiment of the present disclosure.

An electric vehicle according to still another aspect of the present disclosure may comprise the battery management device according to an embodiment of the present disclosure.

Advantageous Effects

According to an embodiment of the present disclosure, when a plurality of slave controllers are included in a battery management device, an ID of each slave controller may be effectively allocated.

In particular, according to an embodiment of the present disclosure, when the slave controllers and the master controller are wirelessly connected, the present disclosure may be more effectively applied. Moreover, in the present disclosure, IDs may be respectively allocated to the slave controllers even in an environment in which information about the arrangement locations of the slave controllers is not previously input to the master controller.

In addition, according to an embodiment of the present disclosure, IDs of the slave controllers may be allocated using a voltage sensing configuration of the battery cells. Therefore, the configuration for ID allocation is not complicated, and IDs may be allocated more quickly.

The effects of the present disclosure are not limited to the effects mentioned above, and other effects not mentioned will be clearly understood by those skilled in the art from the following detailed description and the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in describing the present disclosure, if it is determined that detailed description of a related configuration or function may obscure the gist of the present disclosure, the detailed description will be omitted.

Terms including ordinal numbers, such as first and second, are used for the purpose of distinguishing any one of various components from the others, and are not used to limit the components by the terms.

Throughout the specification, when a part "includes" a certain component, it means that the part may further include other components, without excluding other components, unless otherwise stated. In addition, throughout the specification, when a part is "connected" to another part, this includes not only the case where these parts are "directly connected" but also the case where these parts are "indirectly connected" with another element being interposed therebetween.

Figure 1:
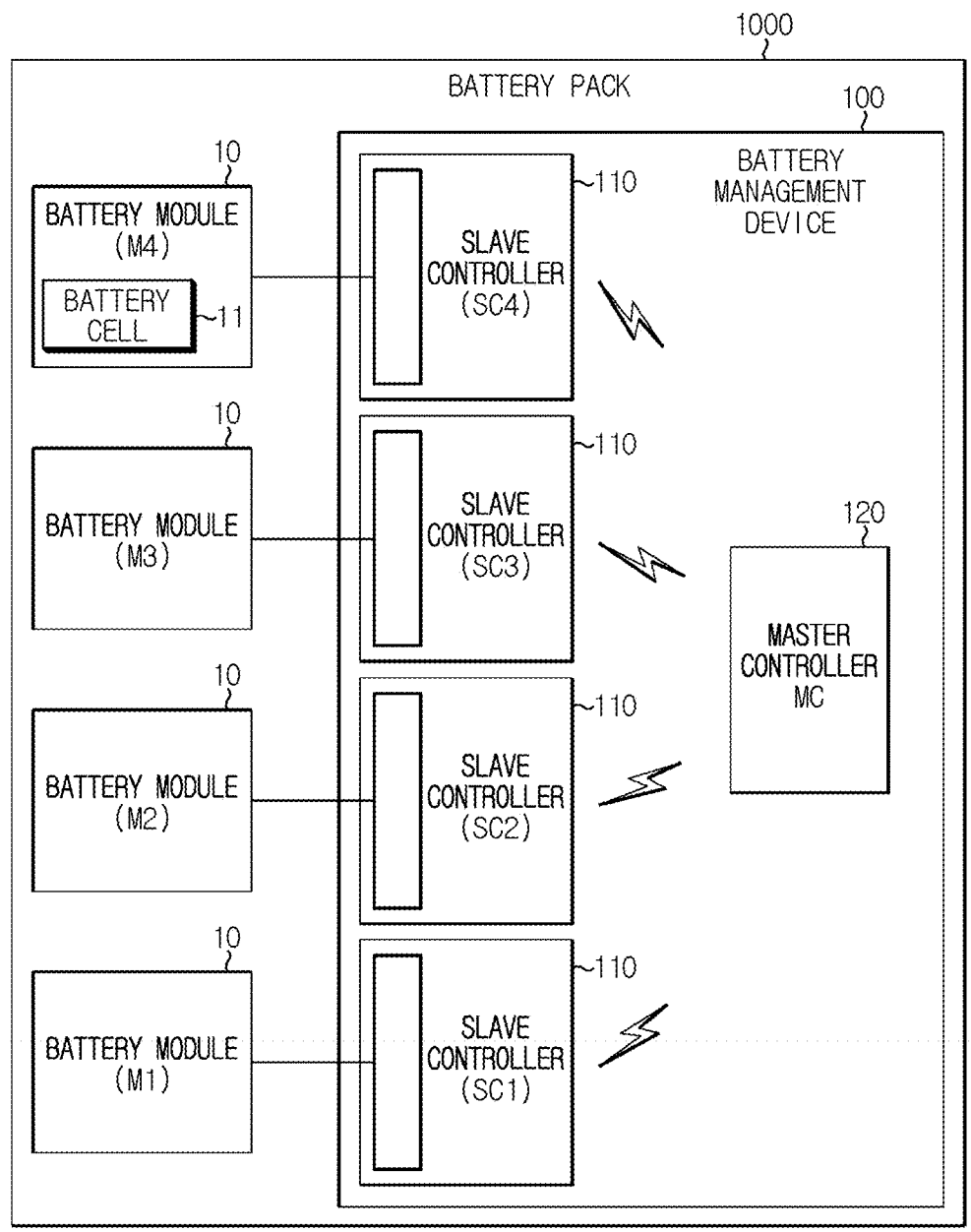
FIG. 1 is a diagram schematically showing a battery pack including a battery management device according to an embodiment of the present disclosure.

FIG. 1 is a diagram schematically showing a battery pack including a battery management device according to an embodiment of the present disclosure.

Referring to FIG. 1, a battery pack 1000 may include a battery module 10 and a battery management device 100.

Two or more battery modules 10 may be included in the battery pack 1000. In addition, each battery module 10 may include at least one battery cell 11. However, it should be noted FIG. 1 shows that one battery cell 11 is included in the battery module M4 for convenience of explanation.

Here, the battery cell 11 is a secondary battery that may be charged and discharged, and, for example, at least one of a lithium metal battery, a lithium ion battery (LIB), a lithium ion polymer battery (LIPB) and a lithium polymer battery (LPB) may be applied.

The battery management device 100 may manage the battery pack 1000. In particular, the battery management device 100 may include a slave controller 110 and a master controller 120 to manage the battery pack 1000 including a plurality of battery modules 10.

The slave controller 110 may monitor and control the state of a battery module 10 connected thereto. The slave controller 110 may also be expressed as a slave battery management system (BMS), a sub BMS, or a cell module controller (CMC).

The master controller 120 allocates a regular ID to the slave controller 110 connected thereto, and monitors and controls the state of the battery module 10 through the connected slave controller 110. For example, the master controller 120 may be expressed as a master BMS or a main BMS.

In particular, if a plurality of battery modules 10 are included in the battery pack 1000, a plurality of slave controllers 110 may be included in the battery management device 100 to manage and control each of the battery modules 10. In this case, the slave controller 110 may be connected to at least one battery module 10. For example, first to $n^{th}$ slave controllers may be included in the battery management device 100, and the first to $n^{th}$ slave controllers may be included in the battery pack 1000. At this time, each slave controller 110 may be connected to each battery module 10 in a one-to-one relationship.

More specifically, as shown in FIG. 1, if the battery pack 1000 includes four battery modules M1, M2, M3 and M4, a first slave controller SC1 may be connected to the first battery module M1, a second slave controller SC2 may be connected to the second battery module M2, a third slave controller SC3 may be connected to the third battery module M3, and a fourth slave controller SC4 may be connected to the fourth battery module M4.

In addition, each of slave controllers SC1, SC2, SC3 and SC4 may monitor, manage and control the battery modules M1, M2, M3 and M4 respectively connected thereto. The operations of the slave controller SC1, SC2, SC3 and SC4 to monitor, manage and control the battery modules M1, M2, M3 and M4 may adopt various operations known at the time of filing of this application, and its detailed description will be omitted and the differences are mainly explained.

The slave controller 110 may include at least one sensing port and at least one ID allocation port.

Here, the sensing port may be connected to the battery cell 11 provided in the battery module 10 through a sensing line. In addition, the sensing port may sense a voltage of each of the battery cells 11 of the battery module 10 connected through the sensing line.

For example, the sensing line may be a conducting wire whose one end is connected to a terminal of each battery cell 11 provided in the battery module 10 and the other end is connected to the sensing port. In addition, the slave controller may measure the voltage of each of the battery cells 11 included in the corresponding battery module by using a potential difference between the sensing ports to which the sensing lines are connected as above.

The ID allocation port may be connected to the sensing line. In addition, when connected to the sensing line, the ID allocation port may receive a voltage from the sensing line. This will be described in more detail with reference to FIG. 2.

Figure 2:
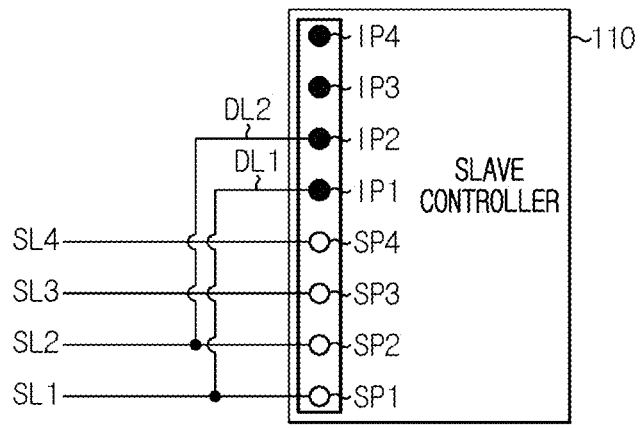
FIG. 2 is a diagram schematically showing a connection configuration of an ID allocation port and a sensing line included in one slave controller, in the battery management device according to an embodiment of the present disclosure.

FIG. 2 is a diagram schematically showing a connection configuration of an ID allocation port and a sensing line included in one slave controller, in the battery management device according to an embodiment of the present disclosure.

Referring to FIG. 2, one slave controller 110 may include a plurality of sensing ports SP1, SP2, SP3 and SP4. In addition, the slave controller 110 may be connected to one battery module through a plurality of sensing ports SP1, SP2, SP3 and SP4 and a plurality of sensing lines SL1, SL2, SL3 and SL4.

In addition, each slave controller 110 may include a plurality of ID allocation ports IP1 and IP2, IP3 and IP4. In this case, in at least some slave controllers 110, at least a portion of the ID allocation ports may be connected to the sensing line.

For example, as shown in FIG. 2, if one slave controller 110 includes four ID allocation ports IP1, IP2, IP3 and IP4, two ID allocation ports IP1 and IP2 among them may be connected to two sensing lines SL1 and SL2 among four sensing lines SL1, SL2, SL3 and SL4, respectively.

In this case, the ID allocation port may receive a voltage from the sensing line. For example, in the configuration of FIG. 2, two ID allocation ports IP1 and IP2 may receive a voltage from two sensing lines SL1 and SL2.

In this way, the ID allocation ports are selectively connected to diverged lines diverged from the sensing line, and a voltage may be applied thereto through the diverged line that is selectively connected thereto.

The master controller 120 may be connected to a plurality of slave controllers 110. For example, the master controller 120 may be connected to the plurality of slave controllers 110 by wire or wireless.

In addition, the master controller 120 may receive information about the voltage applied to the ID allocation port from the slave controller 110. For example, in the configuration of FIG. 2, two ID allocation ports IP1 and IP2 of the slave controller 110 may be connected to two sensing lines SL1 and SL2 to receive a voltage therefrom. At this time, the case where a voltage is applied to the ID allocation port and the case where a voltage is not applied may be indicated as 1 and 0, respectively. In this case, since a voltage is applied to two ID allocation ports IP1 and IP2 and a voltage is not applied to the remaining two ID allocation ports IP3 and IP4, the slave controller 110 may generate 0011 as the voltage information by expressing the information about the voltage applied to the ID allocation ports IP1, IP2, IP3 and IP4 in order from a right digit. That is, the first ID allocation port IP1 may corresponds to a $2^0$ digit, the second ID allocation port IP2 may correspond to a 21 digit, the third ID allocation port IP3 may correspond to a 22 digit, and the fourth ID allocation port IP4 may correspond to a 23 digit. If this is expressed as a binary bit, the first ID allocation port IP1 may correspond to a least significant bit (LSB), and the fourth ID allocation port IP4 may correspond to a most significant bit (MSB).

Preferably, the voltage information generated by each of the plurality of slave controllers may be a temporary ID.

In addition, the slave controller 110 may transmit the applied voltage information (0011) of the ID allocation port generated as described above to the master controller 120. Then, the master controller 120 may receive the information about the voltage from the slave controller 110.

The master controller 120 may allocate a regular ID to each of the plurality of slave controllers 110 based on the information about the voltage received from each slave controller 110.

For example, in the embodiment of FIG. 1, the master controller 120 may receive the information about the voltage applied to the ID allocation port of each slave controller from each of the first slave controller SC1, the second slave controller SC2, the third slave controller SC3 and the fourth slave controller SC4. In addition, based on the received result, the master controller 120 may allocate regular IDs of the first slave controller SC1, the second slave controller SC2, the third slave controller SC3 and the fourth slave controller SC4 as S1, S2, S3 and S4, respectively.

Preferably, among the plurality of slave controllers SC1, SC2, SC3, and SC4, the slave controller to which the regular ID is allocated may release the ID allocation port. For example, the slave controller allocated with the regular ID may release the ID allocation port so that a current of the battery is not distributed through the diverged line during the process of measuring a voltage of the battery. In this case, since the ID allocation port is released, the accuracy in measurement of the voltage of the battery may be improved after the regular ID is allocated.

According to this configuration of the present disclosure, the ID of the slave controller 110 may be effectively allocated to the master controller 120 even in an environment in which information about a location where the slave controller 110 is disposed is not input in advance.

That is, in the present disclosure, regardless of the physical location or arrangement of the slave controller, the master controller may simply and quickly allocate IDs of several slave controllers based on the voltage applied to the ID allocation ports of the slave controllers. In this case, since each slave controller only needs to transmit the information of the voltage applied to the ID allocation port along with its own identification information such as a temporary ID to the master controller, the slave controller does not require much processing performance or data capacity for this, and communication capacity may also be reduced. Moreover, in the present disclosure, the voltage applied to the ID allocation port, which is basic information for ID allocation, may be supplied from the sensing line. Therefore, a separate voltage source for applying a voltage to the ID allocation port may not be required to receive the ID.

In addition, in the present disclosure, since a corresponding diverged line is connected to each of the plurality of slave controllers SC1, SC2, SC3 and SC4, a separate resistor element for a voltage drop may not be disposed in the diverged line. That is, temporary IDs for distinguishing the plurality of slave controllers SC1, SC2, SC3 and SC4 may be allocated according to whether a voltage is applied to the ID allocation port. Therefore, since the temporary ID is not allocated based on the voltage value, the temporary ID allocating process may be less affected by factors such as voltage fluctuation caused by battery deterioration or resistance increase caused by aging of the line.

Preferably, the ID allocation ports may be selectively connected to a diverged line diverged from the sensing line. For example, referring to FIG. 2, among the ID allocation ports IP1, IP2, IP3 and IP4, two ID allocation ports IP1 and IP2 may be connected to the diverged line DL1 and DL2 respectively diverged from the sensing lines SL1 and SL2.

In this way, the ID allocation ports connected to the diverged lines may receive a voltage through the diverged lines. For example, since the first ID allocation port IP1 connected to the first diverged line DL1 is connected to the first sensing line SL1, a voltage may be applied thereto through the first sensing line SL1 and the first diverged line DL1. Similarly, since the second ID allocation port IP2 connected to the second diverged line DL2 is connected to the second sensing line SL2, a voltage may be applied thereto through the second sensing line SL2 and the second diverged line DL2. The ID allocation ports IP3 and IP4 not connected to the diverged lines DL1 and DL2 may not receive the voltage.

According to this configuration of the present disclosure, a configuration for supplying a sensing power to the ID allocation port may be implemented using a simple circuit, for example through to a simple signal line connection.

Also preferably, the slave controller 110 may be configured such that only a specific ID allocation port among the ID allocation ports included in each slave controller 110 is electrically connected to the sensing line. Here, the specific ID allocation port may include an ID allocation port arranged at a location set according to sequence number information of the battery module 10 connected to the slave controller 110. In particular, all slave controllers included in the battery module may be configured such that the ID allocation ports are electrically connected to the sensing lines in a different way.

That is, in the plurality of slave controllers, only a specific ID allocation port among the ID allocation ports may be electrically connected to the sensing line. In this case, the specific ID allocation port may be set differently for each slave controller.

According to the present disclosure, the master controller 120 may easily estimate location information of each battery module 10 based on the voltage information applied to the specific ID allocation port. That is, by simply connecting the ID allocation port to the sensing line, it is possible to easily identify each of the plurality of slave controllers.

In addition, based on a relatively simple connection configuration, when the slave controller 110 is replaced, the diverged line may be connected only to the specific ID allocation port of the replaced slave controller. That is, even if a specific ID allocation port corresponding to the disposed position is not directly selected in the replaced slave controller, the specific ID allocation port may be determined through the connection with the diverged line. Therefore, the replacement of the slave controller 110 is relatively easy, and the process of allocating the regular ID to the replaced slave controller may be performed quickly.

Specifically, the plurality of slave controllers may transmit information about the ID allocation port electrically connected to the sensing line in a binary expression to the master controller. That is, the specific ID allocation port connected to the sensing line may represent the identification information of each slave controller in a binary expression. In particular, 1 may be selected as a specific ID allocation port electrically connected to the sensing line, and 0 may be selected as other ID allocation ports that are not electrically connected to the sensing line. For example, in the case of the slave controller shown in FIG. 2, the first ID allocation port IP1 and the second ID allocation port IP2 are connected to the first sensing line SL1 and the second sensing line SL2, respectively, and may be expressed as 1. Meanwhile, in the configuration of FIG. 2, the third ID allocation port IP3 and the fourth ID allocation port IP4 are not connected to the sensing line and thus may be expressed as 0. In addition, the slave controller may identify which ID allocation port is connected to the sensing line through the information (1 or 0) selected to each of the plurality of ID allocation ports.

In particular, the plurality of slave controllers 110 may set the order information of the ID allocation ports identically. In addition, each slave controller 110 may display 1 or 0 in the same set order of the ID allocation ports and transmit it to the master controller 120.

For example, referring to FIGS. 1 and 2, the first to fourth slave controllers SC1, SC2, SC3 and SC4 may respectively include the ID allocation ports IP1, IP2, IP3 and IP4 to be arranged at the same location. In addition, the first to fourth slave controllers SC1, SC2, SC3 and SC4 may transmit the information of the voltage applied to the four ID allocation ports to the master controller in order.

According to this embodiment of the present disclosure, the identification information of each slave controller may be easily set through the sensing line connection configuration of the ID allocation port. That is, by selecting 1 or 0 depending on whether a sensing voltage is applied to each of the plurality of ID allocation ports, each slave controller 110 may simply set the identification information of each ID allocation port and easily transmit the related information to the master controller 120.

Moreover, the ID allocation port for each slave controller 110 may be set according to sequence information of a correspondingly connected battery module.

For example, as shown in FIGS. 1 and 2, the first slave controller SC1 may be connected to the first battery module M1, the second slave controller SC2 may be connected to the second battery module M2, the third slave controller SC3 may be connected to the third battery module M3, and the fourth slave controller SC4 may be connected to the fourth battery module M4. In this case, it is assumed that the sequence information of the first to fourth battery modules M1 to M4 is 0 to 3. Here, the sequence information may be information indicating physical locations of the battery modules in the battery pack in sequence. In this configuration, the sequence information of the battery modules, namely 0, 1, 2, 3, may be expressed as binary numbers having a predetermined number of digits. For example, if each sequence information is expressed as a 4-digit binary number, the first slave controller SC1 having the sequence information of 0 may be represented as 0000, and the second slave controller SC2 having the sequence information of 1 may be represented as 0001. In addition, the third slave controller SC3 having the sequence information of 2 may be represented as 0010, and the fourth slave controller SC4 having the sequence information of 3 may be represented as 0011. Here, even though a binary number having four digits is expressed, the number of digits may increase or decrease depending on the number of all battery modules 10 included in the battery pack 1000.

According to this configuration of the present disclosure, it is easy to grasp the sequence information of the battery module 10 only with the binary information obtained from the ID allocation port of each slave controller 110. That is, the master controller 120 may grasp the sequence information of the battery module corresponding to each slave controller 110 according to the binary information corresponding to each ID allocation port from each slave controller 110. Therefore, in this case, the master controller 120 may identify a physical location of the corresponding battery module 10 based on the identification information for each slave controller 110 and provide it to the user. In this case, the user may easily grasp the location of the specific battery module and perform appropriate and rapid processing.

Here, in the case of the first slave controller SC1, the ID allocation ports IP1, IP2, IP3 and IP4 included therein may not include a specific ID allocation port, namely an ID allocation port to which a sensing voltage is applied.

Next, in the case of the second slave controller SC2, only the first ID allocation port IP1 among the ID allocation ports IP1, IP2, IP3 and IP4 included therein may be included as the specific ID allocation port.

In addition, in the case of the third slave controller SC3, only the second ID allocation port IP2 among the ID allocation ports IP1, IP2, IP3 and IP4 included therein may be included as the specific ID allocation port.

And, only the first and second ID allocation ports IP1 and IP2 among the ID allocation ports IP1, IP2, IP3 and IP4 included in the fourth slave controller SC4 may be included as the specific ID allocation port. That is, according to this embodiment of the present disclosure, in the binary expression based on the sequence information of the battery modules 10, only the ID allocation port arranged at the position corresponding to the position containing the value of 1 is configured to be connected to the sensing line. Therefore, the design of the slave controller 110 may be simplified by minimizing the number of ID allocation ports included in the slave controller 110.

Also preferably, a plurality of sensing ports may be provided to each slave controller 110 and connected to a plurality of sensing lines.

For example, referring to FIG. 2, a plurality of sensing ports SP1, SP2, SP3 and SP4 are provided to each slave controller 110, and the sensing ports SP1, SP2, SP3 and SP4 may be connected to a plurality of sensing lines SL1, SL2, SL3 and SL4, respectively.

Here, the specific ID allocation port may be connected to a diverged line diverged from a specific sensing line among the plurality of sensing lines. For example, in each of the plurality of slave controllers, a specific ID allocation port may be connected to a diverged line diverged from the specific sensing line according to the sequence information of the battery module 10 connected to each slave controller 110 to which the specific ID allocation port belongs.

That is, by selectively connecting the diverged line to the specific ID allocation port selected according to the sequence information of the battery module 10, the sequence information of the battery module 10 connected to the slave controller 110 may be more accurately estimated. This will be described in more detail with reference to FIGS. 3 and 4.

Figure 3:
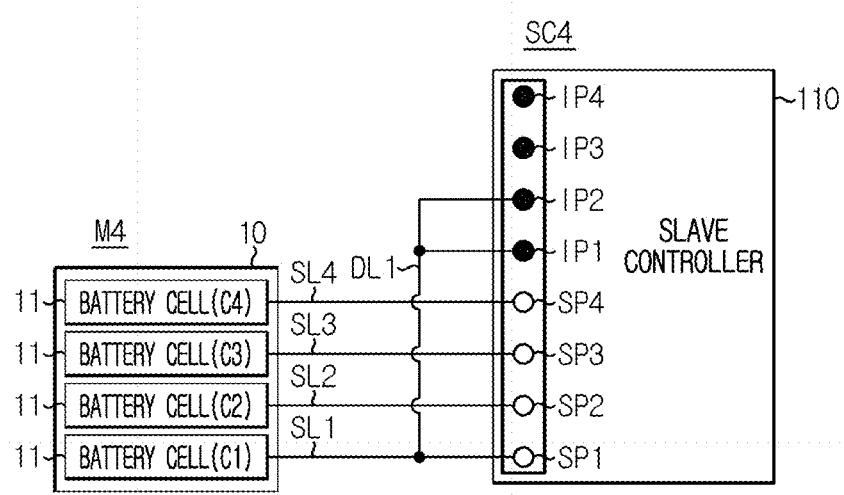
FIG. 3 is a diagram schematically showing that one slave controller is connected to one battery module, in the battery management device according to an embodiment of the present disclosure.

First, FIG. 3 is a diagram schematically showing that one slave controller is connected to one battery module, in the battery management device according to an embodiment of the present disclosure. Specifically, FIG. 3 may be regarded as a diagram schematically showing the connection configuration of the fourth battery module M4 and the fourth slave controller SC4 in the configuration of FIG. 1.

Referring to FIG. 3, the fourth battery module M4 may include first to fourth battery cells C1, C2, C3 and C4. The first battery cell C1 may be connected to the first sensing port SP1 through the first sensing line SL1, and the second battery cell C2 may be connected to the second sensing port SP2 through the second sensing line SL2. In addition, the third battery cell C3 may be connected to the third sensing port SP3 through the third sensing line SL3, and the fourth battery cell C4 may be connected to the fourth sensing port SP4 through the fourth sensing line SL4. Specifically, a positive terminal of the battery cell may be connected to the sensing port through the sensing line.

Here, the first and second battery cells C1 and C2 may be selected as specific battery cells according to the sequence information of the fourth battery module M4. In this case, the first and second ID allocation ports IP1 and IP2 may be connected to the first diverged line DL1 diverged from the first sensing line SL1 connected to the first battery cell C1. Therefore, when a voltage is applied from the first battery cell C1 to the first sensing port SP1 through the first sensing line SL1, the first and second ID allocation ports IP1 and IP2 may receive the voltage through the first diverged line DL1.

At this time, preferably, the specific ID allocation port may be configured to be connected to the diverged line diverged from the sensing line connected to the specific battery cell in a one-to-one relationship. This will be described in more detail with reference to FIG. 4.

Figure 4:
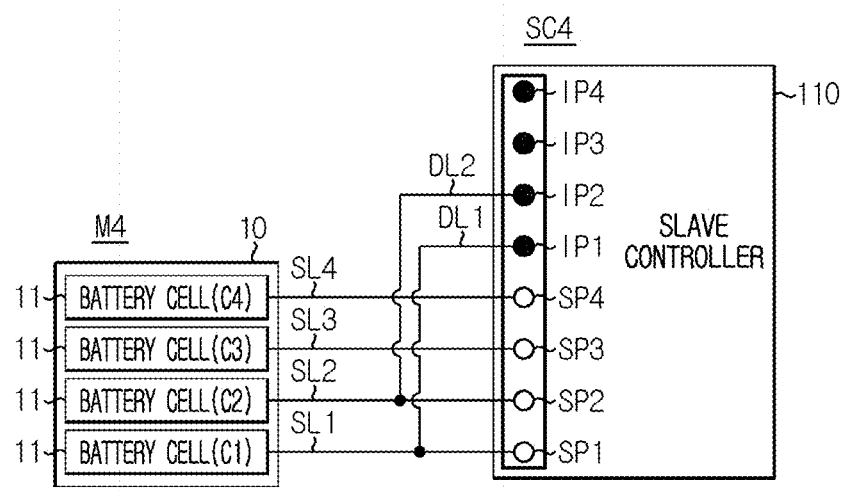
FIG. 4 is a diagram schematically showing that one slave controller is connected to one battery module, in a battery management device according to another embodiment of the present disclosure.

FIG. 4 is a diagram schematically showing that one slave controller is connected to one battery module, in a battery management device according to another embodiment of the present disclosure. Specifically, FIG. 4 may be regarded as a diagram schematically showing the connection configuration of the fourth battery module M4 and the fourth slave controller SC4 in the configuration of FIG. 1.

Referring to FIG. 4, the first and second battery cells C1 and C2 may be selected as specific battery cells according to the sequence information of the fourth battery module M4. In addition, the first ID allocation port IP1 may be connected to the first diverged line DL1 diverged from the first sensing line SL1 connected to the first battery cell C1. Also, the second ID allocation port IP2 may be connected to the second diverged line DL2 diverged from the second sensing line SL2 connected to the second battery cell C2. Therefore, when a voltage is applied from the first battery cell C1 to the first sensing port SP1 through the first sensing line SL1, the first ID allocation port IP1 may receive the voltage through the first diverged line DL1. In addition, when a voltage is applied from the second battery cell C2 to the second sensing port SP2 through the second sensing line SL2, the second ID allocation port IP2 may receive the voltage through the second diverged line DL2.

According to this configuration of the present disclosure, it is possible to minimize diverging of the sensing line by connecting one ID allocation port to one diverged line. Therefore, it is possible to prevent the circuit from being complicated by diverging three or more lines from one branch point. In addition, since the specific ID allocation port and the diverged line are connected in a one-to-one relationship, even if an unexpected problem such as a disconnection of the sensing line or the diverged line occurs, damage may be minimized. Also, since a voltage is diverged and applied from only one sensing line to one ID allocation port, it is possible to prevent or minimize the problem that a current flowing to the sensing port or the ID allocation port is reduced. Therefore, in this case, it is possible to prevent the problem that sensing or ID allocation is not properly performed due to the reduction of a current applied to the port.

Also preferably, the plurality of slave controllers 110 may be configured to include a minimum integer number equal to or greater than $\log_2 N$ of ID allocation ports. Here, N may be the number of all battery modules 10 included in the battery pack 1000 according to an embodiment of the present disclosure.

That is, in order to select a specific ID allocation port based on the binary expression according to the sequence information of the battery module 10, the slave controller 110 may include the number of ID allocation ports corresponding to an integer greater than or equal to $\log_2 N$. For example, if the number of all battery modules 10 included in the battery pack 1000 is 9 to 16, $\log_2 N$ becomes a value greater than 3 and equal to or smaller than 4. Accordingly, in this case, each of the plurality of slave controllers 110 may include at least four ID allocation ports.

In particular, the plurality of slave controllers may be configured to include a minimum integer number equal to or greater than $\log_2 N$ of ID allocation ports. This will be described in more detail with reference to FIG. 5.

Figure 5:
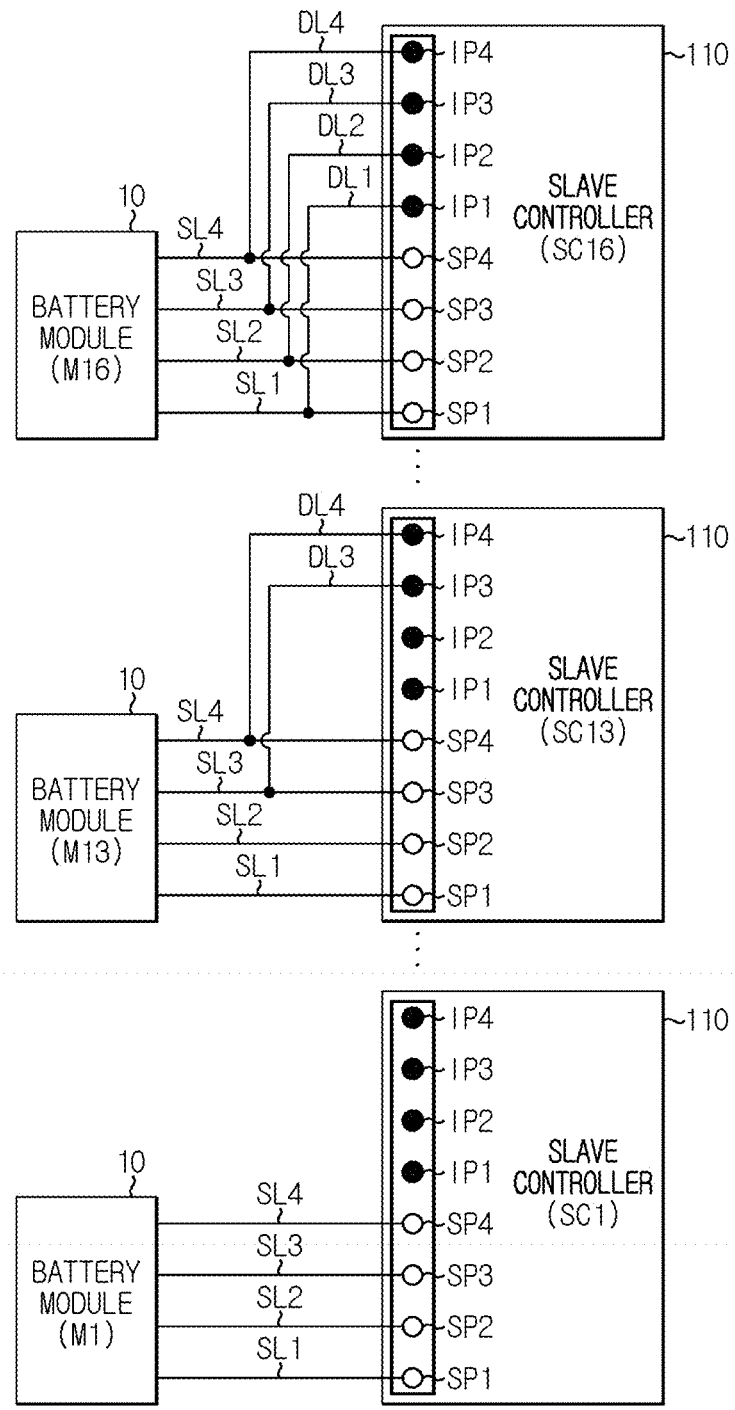
FIG. 5 is a diagram briefly showing that a plurality of slave controllers is connected to a plurality of battery modules, in the battery management device according to an embodiment of the present disclosure.

FIG. 5 is a diagram briefly showing that a plurality of slave controllers is connected to a plurality of battery modules, in the battery management device according to an embodiment of the present disclosure.

Referring to FIG. 5, the battery pack 1000 includes 16 battery modules 10 in total. Therefore, in this case, N=16, and $\log_2 N$ is $\log_2 16$ that is 4. Therefore, each of the plurality of slave controllers 110 may include four or more ID allocation ports, particularly four ID allocation ports. That is, in the configuration of FIG. 5, each slave controller 110 may include four ID allocation ports IP1, IP2, IP3 and IP4. If four ID allocation ports are included as above, it is possible to identify 16 battery modules. For example, the sequence information of the $16^{th}$ battery module M16 may be 15, and 4 digits are required to express 15 as a binary number. Therefore, each slave controller 110 may include four ID allocation ports IP1, IP2, IP3 and IP4.

According to this configuration of the present disclosure, the of plurality of slave controllers 110 may be identified while minimizing the number of ID allocation ports. Since the slave controller 110 includes ID allocation ports in a number corresponding to the number of digits of a binary number expressed according to the sequence information of the connected battery module 10, the sequence information of the battery module 10 connected to the slave controller 110, namely the arranged position thereof, may be estimated using a minimum number of ID allocation ports.

Also preferably, the plurality of slave controllers 110 may generate information about the voltage applied to the ID allocation ports based on the order in which the ID allocation ports are arranged.

For example, referring to FIG. 5, the plurality of slave controllers 110 may determine whether a voltage is applied to the ID allocation ports IP1, IP2, IP3 and IP4 according to the arrangement order of the ID allocation ports IP1, IP2, IP3 and IP4 and generate information about the applied voltage.

Since the ID allocation ports IP1, IP2, IP3 and IP4 included in the first slave controller SC1 are not connected to the sensing lines SL1, SL2, SL3 and SL4, the first slave controller SC1 may generate 0000 as the information about the applied voltage.

Similarly, the third ID allocation port IP3 included in the $13^{th}$ slave controller SC13 may be connected to the third diverged line DL3 diverged from the third sensing line SL3, and the fourth ID allocation port IP4 may be connected to the fourth diverged line DL4 diverged from the fourth sensing line SL4. In addition, the $13^{th}$ slave controller SC13 may express the third ID allocation port IP3 and the fourth ID allocation port IP4 to which a voltage is applied as 1 and express the first ID allocation port IP1 and the second ID allocation port IP2 to which a voltage is not applied as 0. Therefore, the $13^{th}$ slave controller SC13 may generate 1100 as the information about the applied voltage by expressing the first ID allocation port IP1 at a rightmost side of the binary number and expressing the fourth ID allocation port IP4 at a leftmost side of the binary number.

Likewise, the first to fourth ID allocation ports IP1, IP2, IP3 and IP4 included in the 16$^{th}$ slave controller SC16 may be connected to the first to fourth diverged lines DL1, DL2, DL3 and DL4, respectively. If the first to fourth ID allocation ports IP1, IP2, IP3 and IP4 receive voltages from the first to fourth diverged lines DL1, DL2, DL3 and DL4, respectively, the 16$^{th}$ slave controller SC16 may generate 1111 as the information about the applied voltage.

Each of the plurality of slave controllers 110 may transmit the generated voltage information and a previously stored temporary ID to the master controller 120. That is, each slave controller 110 may generate voltage information about the voltage applied to the ID allocation port and transmit the previously stored temporary ID and the generated voltage information to the master controller 120.

For example, referring to FIG. 1, each slave controller 110 and the master controller 120 may be connected to each other by wire or wireless. Each slave controller 110 may transmit the generated voltage information together with the previously stored temporary ID to the master controller 120, so that the master controller 120 may generate a regular ID based on the voltage information.

The master controller 120 may receive the voltage information and the temporary ID from each of the plurality of slave controllers 110 and generate a regular ID corresponding to the received voltage information based on a previously stored regular ID allocation table.

For example, referring to FIG. 1, the master controller 120 may receive the voltage information of 0000 from the first slave controller SC1 and generate a regular ID for the first slave controller SC1 by matching the received voltage information to the previously stored regular ID allocation table. Similarly, the master controller 120 receives the voltage information from the second to fourth slave controllers SC2, SC3 and SC4 and generate regular IDs for the second to fourth slave controllers SC2, SC3 and SC4 based on the received voltage information.

The master controller 120 may match the temporary ID received from each slave controller 110 with the generated regular ID in a one-to-one relationship to generate a data pair including them.

For example, the master controller 120 may generate a first data pair in which the first temporary ID received from the first slave controller SC1 is matched with the first regular ID for the first slave controller SC1 in a one-to-one relationship. Similarly, the master controller 120 may generate second to fourth data pairs for the second to fourth slave controllers SC2, SC3 and SC4.

The master controller 120 may transmit the generated data pair to all of the plurality of slave controllers 110. In particular, in the case of wireless communication, the master controller 120 is not able to make communication by selecting a specific slave controller 110 and may be configured to transmit all of the generated data pairs to all of the slave controllers 110. For example, the first to fourth data pairs generated by the master controller 120 may be transmitted to all of the first to fourth slave controllers SC1, SC2, SC3 and SC4.

The plurality of slave controllers 110 may receive the data pairs from the master controller 120 and select a data pair including the temporary ID previously stored therein among the received data pairs. That is, the master controller 120 is often not able to communicate by selecting a specific slave controller 110. In this case, by including the temporary ID received from the slave controller 110 as an identifier in the generated data pair, it is possible to specify the slave controller 110 corresponding to the generated data pair. Therefore, each of the plurality of slave controllers 110 receives all generated data pairs from the master controller 120 but may select only the data pair that includes the temporary ID previously stored therein.

The plurality of slave controllers 110 may update the previously stored temporary ID with the regular ID included in the selected data pair. That is, as each of the plurality of slave controllers 110 updates the previously stored temporary ID with the regular ID included in the data pair received from the master controller 120, the regular ID allocation operation of the slave controller 110 included in the battery management device 100 according to an embodiment of the present disclosure may be terminated.

After the regular ID allocation operation is terminated, the plurality of slave controllers 110 may generate the information of the voltage applied to the sensing port and transmit the generated voltage information to the master controller 120 together with the regular ID. The master controller 120 may estimate the sequence information of the battery module 10 connected to each slave controller 110 by checking the received regular ID and diagnose the state of the battery module 10 based on the estimated sequence information and the received voltage information.

Figure 6:
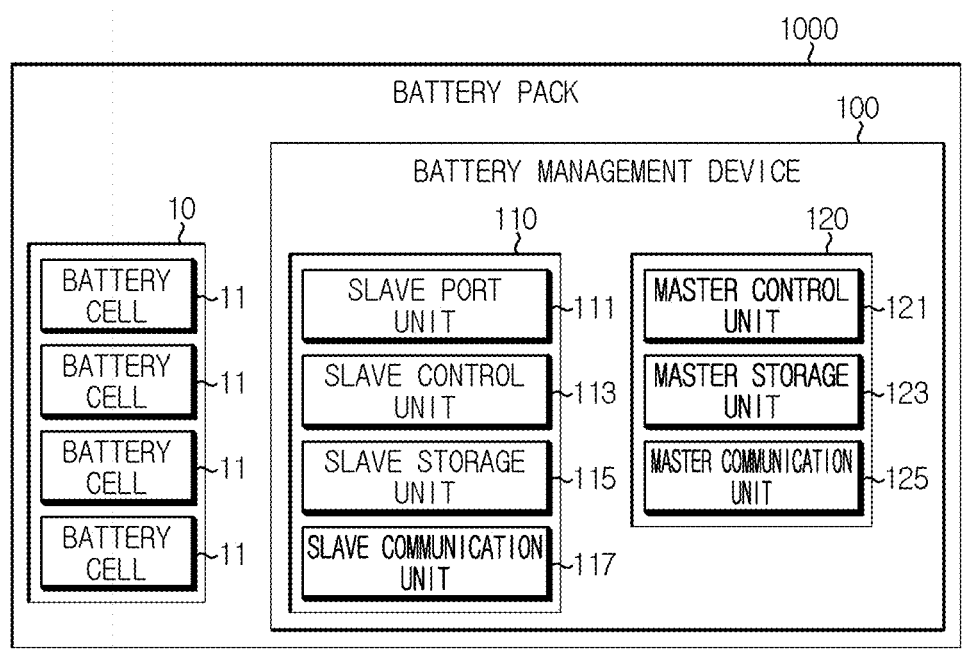
FIG. 6 is a block diagram schematically showing a functional configuration of the battery management device according to an embodiment of the present disclosure.

FIG. 6 is a block diagram schematically showing a functional configuration of the battery management device according to an embodiment of the present disclosure.

First, referring to FIG. 6, the slave controller 110 may include a slave port unit 111, a slave control unit 113, a slave storage unit 115 and a slave communication unit 117. Next, the master controller 120 may include a master control unit 121, a master storage unit 123 and a master communication unit 125.

The slave port unit 111 may include a sensing port and an ID allocation port. That is, the slave port unit 111 may include sensing ports corresponding to the number of battery cells 11 included in the battery module 10 and ID allocation ports corresponding to the number of all battery modules 10 included in the battery pack 1000.

Among the ID allocation ports, only a specific ID allocation port connected to the diverged line may be electrically connected to the battery module 10 and receive a voltage from the battery module 10. The slave control unit 113 includes at least one processor and may be operably connected to the slave storage unit 115 and the slave communication unit 117. In addition, the slave control unit 113 may measure the voltage applied to the ID allocation port included in the slave port unit 111 to generate the applied voltage information.

For example, seeing the 13$^{th}$ slave controller SC13 connected to the 13$^{th}$ battery module M13 in the configuration of FIG. 5, a voltage is applied only to the third ID allocation port IP3 and the fourth ID allocation port IP4, and the slave control unit 113 may generate voltage information of 1100.

After generating the voltage information, the slave control unit 113 may transmit the generated voltage information to the master controller 120 through the slave communication unit 117 together with the temporary ID previously stored in the slave storage unit 115.

The slave controller 110 and the master controller 120 may be connected by wire or wireless. Particularly preferably, the slave controller 110 and the master controller 120 may be connected wirelessly. An example where the slave controller 110 and the master controller 120 are connected wirelessly will be described in detail with reference to FIG. 7.

Figure 7:
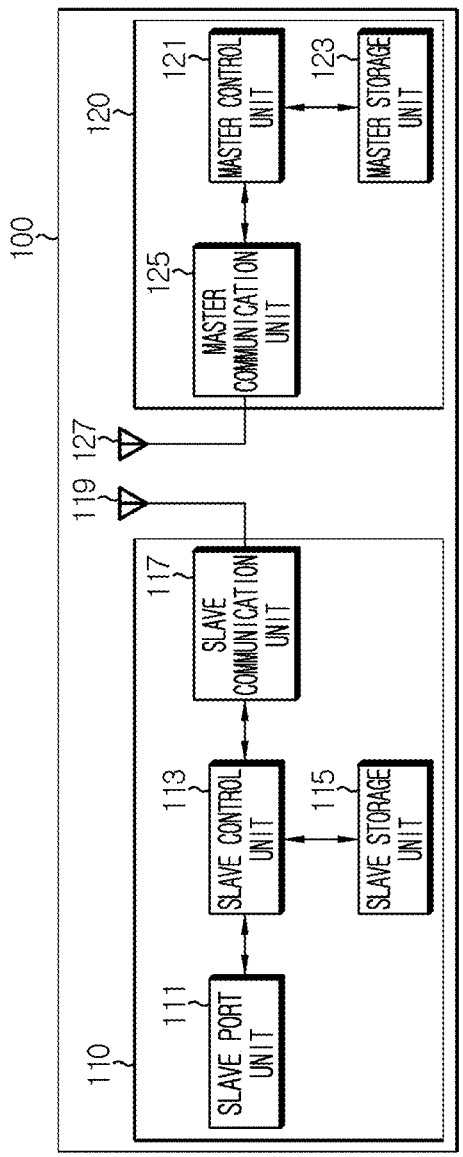
FIG. 7 is a diagram showing an example of a slave controller and a master controller connected wirelessly, in the battery management device according to an embodiment of the present disclosure.

FIG. 7 is a diagram showing an example of a slave controller and a master controller connected wirelessly, in the battery management device according to an embodiment of the present disclosure.

Referring to FIG. 7, when the slave controller 110 and the master controller 120 are connected wirelessly, the slave controller 110 may further include a slave antenna 119 connected to the slave communication unit 117, and the master controller 120 may further include a master antenna 127 connected to the master communication unit 125.

The slave controller 110 and the master controller 120 may communicate with each other through the slave antenna 119 and the master antenna 127, respectively. That is, the slave control unit 113 may transmit the voltage information and the temporary ID previously stored in the slave storage unit 115 to the master controller 120 through the slave antenna 119 connected to the slave communication unit 117.

That is, according to the present disclosure, since the master controller 120 and the slave controller 110 are wirelessly connected, the structure of the battery management device 100 is not complicated, and space utilization in the battery management device 100 is increased. In addition, since a problem such as disconnection of a line connecting the master controller 120 and the slave controller 110 does not occur, it is easy to manage the battery management device 100 and the battery pack 1000 according to the present disclosure.

The master control unit 121 may receive the temporary ID and the voltage information from each of the slave controllers 110 through the master communication unit 125 and generate a regular ID for each of the slave controllers 110 based on the received voltage information.

For example, referring to FIG. 1, when receiving the previously stored temporary ID and the voltage information from the first slave controller SC1, the master control unit 121 may generate a regular ID matched with the received voltage information based on the regular ID allocation table previously stored in the master storage unit 123 and allocate the generated regular ID as a regular ID of the first slave controller SC1.

After generating the regular ID for the slave controller 110, the master control unit 121 may generate a data pair including the temporary ID received from the slave controller 110 and the generated regular ID in a one-to-one relationship.

In addition, the master control unit 121 may transmit the generated data pair to the plurality of slave controllers 110 through the master communication unit 125. Basically, when the master controller 120 and the slave controller 110 are connected using a wireless network, the master controller 120 is not connected to each slave controller 110 through an independent channel but is connected to all of the plurality of slave controllers 110 through the same channel. Thus, the master control unit 121 may transmit all data pairs including the generated regular ID and the received temporary ID to the plurality of slave controllers 110.

The slave control unit 113 may receive the data pairs from the master controller 120 through the slave communication unit 117 and select a data pair including the temporary ID already stored in the slave storage unit 115 among the received data pairs.

The slave control unit 113 may be allocated with the regular ID by changing or updating the temporary ID stored in the slave storage unit 115 to the regular ID included in the selected data pair.

After being allocated with the regular ID, the slave controller 110 may control charging, discharging and balancing of the battery cells 11 included in the connected battery module 10 while communicating with the master controller 120 using the allocated regular ID. Similarly, the master controller 120 may identify each of the plurality of slave controllers 110 by using the regular ID allocated to the slave controller 110 and control each of the battery modules 10 connected to each of the plurality of slave controllers 110.

Meanwhile, the slave storage unit 115 and the master storage unit 123 are not particularly limited in their types, as long as they are known information storage means that can write, erase, update and read data. As an example, the information storage means may include DRAM, SDRAM, flash memory, ROM, EEPROM, registers, and the like. The slave storage unit 115 may store program codes in which processes executable by the slave control unit 113 are defined, and the master storage unit 123 may store program codes in which processes executable by the master control unit 121 are defined.

The battery pack according to the present disclosure may include the battery management device according to the present disclosure described above. In addition, the battery pack according to the present disclosure may include a battery cell having a plurality of secondary batteries, electrical equipment (including BMS, relays, fuses, etc.) and a pack case, in addition to the battery management device.

In addition, as another embodiment of the present disclosure, the battery management device may be mounted to various devices using electric energy, such as an electric vehicle, an energy storage system (ESS), and the like. In particular, the battery management device according to the present disclosure may be included in an electric vehicle. That is, the electric vehicle according to the present disclosure may include the battery management device according to the present disclosure. Here, the battery management device may be included in a battery pack and may be implemented as a separate device from the battery pack. For example, at least a part of the battery management device may be implemented by an ECU of a vehicle.

In addition, the vehicle according to the present disclosure may include a vehicle body or electronic equipment typically provided to the vehicle, in addition to the battery management device. For example, the vehicle according to the present disclosure may include a battery pack, a contactor, an inverter, a motor, at least one ECU, and the like, in addition to the battery management device according to the present disclosure. However, the present disclosure is not particularly limited to other components of the vehicle other than the battery management device.

The embodiments of the present disclosure described above may not be implemented only through a device, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

10: battery module
100: battery management device
110: slave controller
120: master controller
1000: battery pack

What is claimed is:

1. A battery management device for managing a battery pack including a plurality of battery modules, comprising:
a plurality of slave controllers including:
at least one sensing port connected to at least one battery cell provided to the battery modules through a sensing line, and configured to sense a voltage of each connected battery cell; and
at least one ID allocation port configured to receive the voltage from the sensing line when being connected to the sensing line,
the plurality of slave controllers being configured to be connected to at least one corresponding battery module among the battery modules; and
a master controller connected to the plurality of slave controllers, respectively, configured to:
receive voltage information about the voltage applied to the ID allocation port from the slave controller; and
allocate a regular ID to each of the plurality of slave controllers based on the received voltage information.

2. The battery management device according to claim 1, wherein the ID allocation port is further configured to:
be selectively connected to a line diverged from the sensing line; and
receive the voltage through the selectively connected diverged line.

3. The battery management device according to claim 1, wherein the plurality of slave controllers are further configured such that, among the ID allocation ports included therein, only a specific ID allocation port set differently for each slave controller is electrically connected to the sensing line.

4. The battery management device according to claim 3, wherein the plurality of slave controllers are further configured to transmit information about the specific ID allocation port electrically connected to the sensing line to the master controller in a binary expression.

5. The battery management device according to claim 3, wherein:
the sensing port is provided in plural to each slave controller such that the plurality of sensing ports are connected to a plurality of sensing lines; and
the specific ID allocation port is configured to be connected to a line diverged from a specific sensing line among the plurality of sensing lines.

6. The battery management device according to claim 5, wherein the specific ID allocation port is further configured to be connected to the line diverged from the specific sensing line in a one-to-one relationship.

7. The battery management device according to claim 1, wherein:
the plurality of slave controllers are further configured to include a minimum integer number equal to or greater than $\log_2 N$ of ID allocation ports,
where N is a number of all battery modules included in the battery pack.

8. The battery management device according to claim 1, wherein the plurality of slave controllers are further configured to:
generate voltage information about the voltage applied to the ID allocation port based on an arrangement order of the ID allocation port; and
transmit the generated voltage information and a previously stored temporary ID to the master controller.

9. The battery management device according to claim 8, wherein the master controller is further configured to:
receive the generated voltage information and the temporary ID from each of the plurality of slave controllers;
generate a regular ID corresponding to the received voltage information based on a previously stored regular ID allocation table;
match the received temporary ID and the generated regular ID in a one-to-one relationship; and
generate a data pair including the temporary ID and the regular ID matched with each other.

10. The battery management device according to claim 9, wherein:
the master controller is further configured to transmit the data pairs respectively generated for the plurality of slave controllers to all of the plurality of slave controllers; and
the plurality of slave controllers are further configured to:
receive the data pairs;
select a data pair including the previously stored temporary ID among the received data pairs; and
update the previously stored temporary ID to the regular ID included in the selected data pair.

11. The battery management device according to claim 1, wherein the plurality of slave controllers are further configured to be connected to the master controller wirelessly.

12. A battery pack, comprising the battery management device according to claim 1.

13. An electric vehicle, comprising the battery management device according to claim 1.

* * * * *